United States Patent
Chen et al.

(10) Patent No.: US 7,094,659 B2
(45) Date of Patent: Aug. 22, 2006

(54) METHOD OF FORMING DEEP TRENCH CAPACITORS

(75) Inventors: Hsi-Chieh Chen, Hsin-Chu (TW); James Shyu, Taichung (TW); Hippo Wu, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/962,473

(22) Filed: Oct. 13, 2004

(65) Prior Publication Data

US 2005/0079680 A1    Apr. 14, 2005

(30) Foreign Application Priority Data

Oct. 14, 2003    (TW) ............................... 92128380 A
May 3, 2004    (TW) ............................... 93112385 A

(51) Int. Cl.
    *H01L 21/76*    (2006.01)
(52) U.S. Cl. .................... 438/386; 438/240; 438/245; 438/249; 438/392; 438/388
(58) Field of Classification Search ............... 438/240, 438/245, 249, 392, 388, 386; 257/E21.171
    See application file for complete search history.

(56) References Cited

U.S. PATENT DOCUMENTS

| | | | | |
|---|---|---|---|---|
| 4,999,312 A | * | 3/1991 | Yoon ......................... | 438/392 |
| 6,245,612 B1 | * | 6/2001 | Chang et al. ............... | 438/249 |
| 6,440,792 B1 | * | 8/2002 | Shiao et al. ................ | 438/243 |
| 6,635,571 B1 | * | 10/2003 | Joo et al. .................... | 438/688 |
| 6,693,016 B1 | * | 2/2004 | Gutsche et al. ............. | 438/386 |
| 6,750,096 B1 | * | 6/2004 | Steck et al. ................. | 438/243 |
| 6,953,722 B1 | * | 10/2005 | Seidl et al. ................. | 438/240 |

* cited by examiner

*Primary Examiner*—George Fourson
*Assistant Examiner*—Julio J. Maldonado
(74) *Attorney, Agent, or Firm*—Birch, Stewart, Kolasch & Birch, LLP

(57) ABSTRACT

A method of forming a trench capacitor is disclosed. After completion of the bottom electrode of the capacitor, a collar dielectric layer is directly formed on the sidewall of the deep trench using self-starved atomic layer chemical vapor deposition (self-starved ALCVD). Then, a high dielectric constant (high k) dielectric layer is formed overlying the collar dielectric and the bottom portion of the deep trench using atomic layer chemical vapor deposition (ALCVD). Thereafter, a conductive layer is filled into the deep trench and recessed to a predetermined depth. A portion of the dielectric layer and the high dielectric constant (high k) layer at the top of the deep trench are removed to complete the fabrication of the deep trench capacitor.

25 Claims, 20 Drawing Sheets

METHOD OF FORMING DEEP TRENCH CAPACITORS

This Nonprovisional application claims priority under 35 U.S.C. § 119(a) on Patent Application No(s). 092128380 & 093112385 filed in Taiwan, Republic of China on Oct. 14, 2003 & May 3, 2004; respectively, the entire contents of which are hereby incorporated by reference.

BACKGROUND

The invention relates in general to a method of forming deep trench capacitors. In particular, the invention relates to a method of forming deep trench capacitors using self-starved atomic layer chemical vapor deposition (self-starved ALCVD).

DRAM is readable and writeable memory. Each DRAM cell consists of one transistor and one capacitor, obtaining high integrity compared with other memory types, allowing comprehensive application in computers and electronic products. Currently, plane transistors with deep trench capacitors are designed to have a 3-dimensional capacitor structure formed in the deep trench of the semiconductor substrate, minimizing dimensions and power consumption, and accelerating operating speed.

FIG. 1A is a plane view of the deep trench in a conventional DRAM cell. In a folded bit line structure, each active area includes two word lines ($WL_1$ & $WL_2$) and one bit line (BL), with CB representing a bit line contact, and DT representing a deep trench.

FIG. 1B is a cross section of a deep trench capacitor in a conventional DRAM cell. A semiconductor silicon substrate 10 has a deep trench DT, the lower area of which acts as deep trench capacitor 12, consisting of a buried plate, a node dielectric, and a storage node. In fabrication of the deep trench capacitor 12, a deep trench DT is formed in the p-type semiconductor substrate 10 using reactive ion etch (RIE), and $n^+$-type ions are diffused into the lower area of the deep trench DT using a heavy doping oxide, such as ASG, with high temperature annealing, so that an $n^+$-type diffusion area 14 is formed to act as the buried plate of the deep trench capacitor 12. A silicon nitride/oxide structure 16 is formed at the inner sidewall and bottom of the lower area of the deep trench DT, acting as the node dielectric of the deep trench capacitor 12. Subsequently, an $n^+$-type doped first polysilicon layer 18 is formed inside the deep trench DT, recessing the first polysilicon layer 18 at a predetermined depth to act as the storage node of the deep trench capacitor 12.

After completing of the above deep trench capacitor 12, a collar dielectric 20 is fabricated on the upper sidewalls of the deep trench DT. An $n^+$-type doped second polysilicon layer 22 and a third polysilicon layer 24 are sequentially formed on the upper deep trench DT. Afterward, a shallow trench isolation (STI) structure 26, word lines ($WL_1$ & $WL_2$), source/drain diffusion area 28, bit line contacts (CB), and bit lines (BL) processes are performed. The STI structure 26 is formed to isolate the adjacent DRAM cells.

In order to connect the deep trench capacitor 12 to the transistor located on the surface of the substrate 10, a buried strap outdiffusion area 30 is formed in the silicon substrate 10 near the top side area of the deep trench DT, acting as a node junction. The buried strap out-diffusion area 30 is formed using $n^+$-type ions from the second polysilicon layer 22 through the third polysilicon layer 24, and diffused to the adjacent silicon substrate 10, so that the third polysilicon layer 24 acts as a buried strap 24. The collar dielectric layer 20 is formed to insulate the buried strap out-diffusion area 30 and the buried plate 14, potentially preventing from sidewalls current leakage.

FIGS. 2A~2E are cross sections showing fabrication of the conventional deep trench capacitor, wherein the polysilicon conductive layer is filled first, and the collar dielectric is then formed. In FIG. 2A, a p-type semiconductor substrate comprises a pad layer 32, a deep trench DT, an $n^+$-type diffusion area 14, a silicon nitride/oxide layer structure (NO structure) 16, and an $n^+$-type doped first polysilicon layer 18. Next, in FIG. 2B, the first polysilicon layer 18 is recessed and the NO structure 16 at the upper of the deep trench DT is removed. In FIG. 2C, a silicon oxide layer 36 is formed on the pad structure 32 and the deep trench DT using CVD, and the portion of the silicon oxide layer 36 on the top of the first polysilicon layer 18 is then anisotropically etched.

Subsequently, in FIG. 2D, an $n^+$-type doped second polysilicon layer 22 is filled into the deep trench DT, and recessed to a predetermined depth. Finally, in FIG. 2E, a portion of the silicon oxide layer 36 is removed using wet etching resulting in the protrusion of the second polysilicon layer 22. The remained silicon oxide layer 36 acts as a collar dielectric.

In the conventional process, two steps of filling and recessing the polysilicon layers are needed before forming the buried strap 24. While conventional process of fabrication the deep trench capacitor is too long and complicate, process reduction is required.

SUMMARY

An embodiment of the invention provides a method for forming a deep trench capacitor, comprising providing a silicon substrate having a deep trench and a pad structure, wherein a buried plate is formed in the silicon substrate adjacent to the trench. A conformal collar dielectric layer is formed on the pad structure and the upper sidewall of the trench. A conformal high dielectric constant (high k) dielectric layer is formed on the collar dielectric layer, and extends to the bottom and the lower sidewall of the trench as a capacitor dielectric layer. A conductive layer is filled into the trench, and then recessed to a predetermined depth to act as a top electrode. A portion of the high k dielectric layer and the collar dielectric layer on the sidewall of the trench is removed using the conductive layer as a mask.

Another embodiment of the invention provides a method for fabricating a deep trench capacitor. A silicon substrate having a trench is provided. A diffusion barrier layer is formed over the silicon substrate and on a portion of sidewall of the trench using self-starved atomic layer chemical vapor deposition (self-starved ALCVD). A doped layer is formed on the diffusion barrier layer, and extends to the bottom and the lower sidewall of the trench. An annealing step is performed to diffuse doped materials from the doped layer into the lower sidewall of the trench, using the diffusion barrier layer as a mask.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

In this specification, "overlying the substrate", "above the layer", or "on the film" denote a relative positional relationship with respect to the surface of the base layer, regardless of the existence of intermediate layers. Accordingly, these expressions may indicate not only the direct contact of layers, but also, a non-contact state between one or more laminated layers.

In the first embodiment of the invention, a collar dielectric layer is formed prior to the formation of a conductive layer to reduce process steps. In the second embodiment of the invention, a diffusion barrier layer is formed prior to the formation of a capacitor dielectric layer and the deposition of a doped layer, such that process steps are also reduced.

FIRST EMBODIMENT

FIG. 3A~3G illustrate process steps for fabricating a trench capacitor of an embodiment of the invention.

Figure 3A:
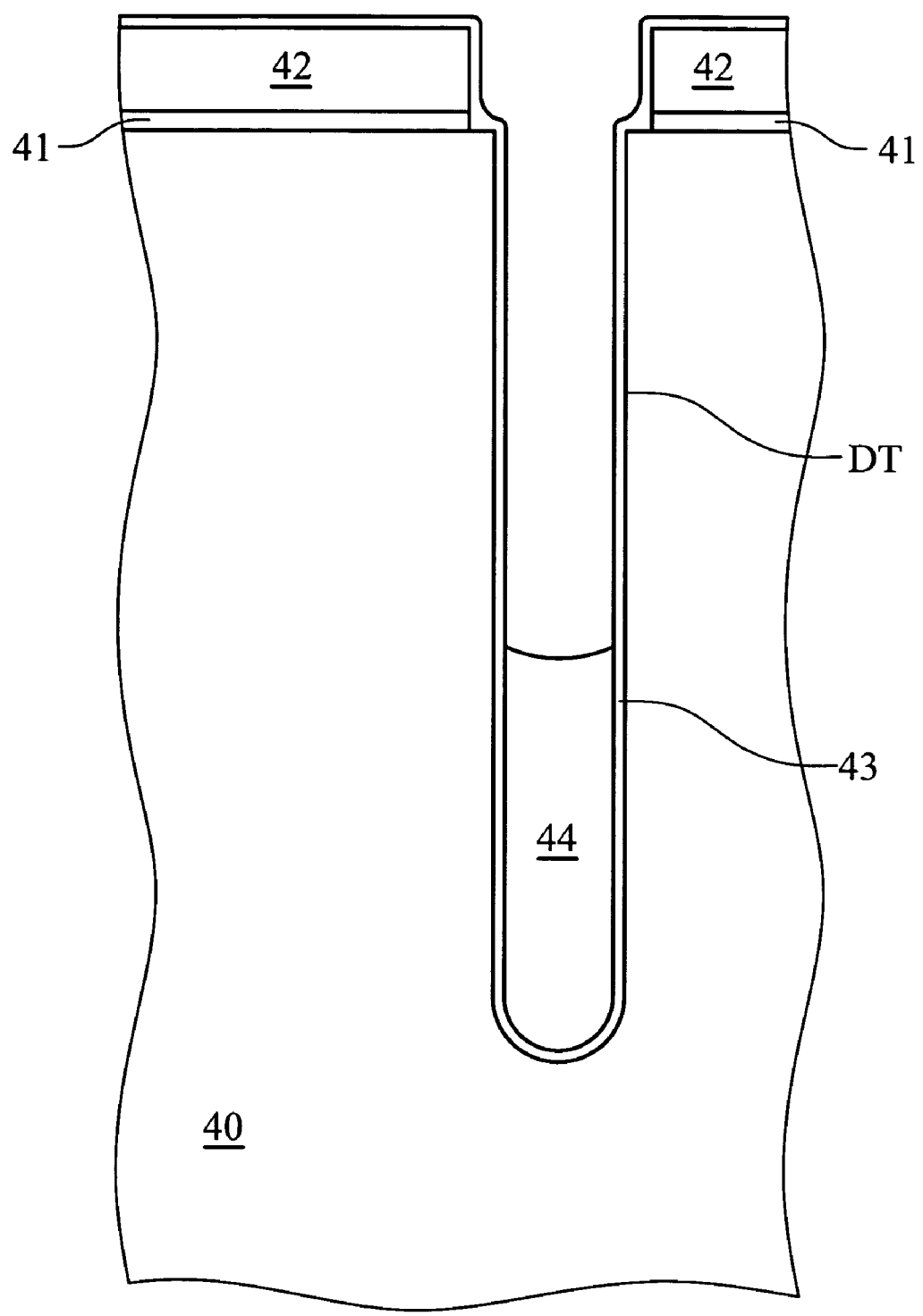
FIG. 3A~3G illustrate process steps for fabricating a trench capacitor of an embodiment of the invention.

In FIG. 3A, a semiconductor substrate 40 is provided having a pad oxide layer 41, a pad nitride layer 42 and a deep trench DT thereon. A doped oxide layer 43, such as ASG, is formed on the bottom and the sidewall of the deep trench DT. Next, a photoresist layer 44 is formed to cover the ASG layer on the bottom and the sidewall of the deep trench DT using spin-coat, then recessed to a predetermined depth using dry etching, remained on the lower portion of the deep trench DT.

Figure 3B:
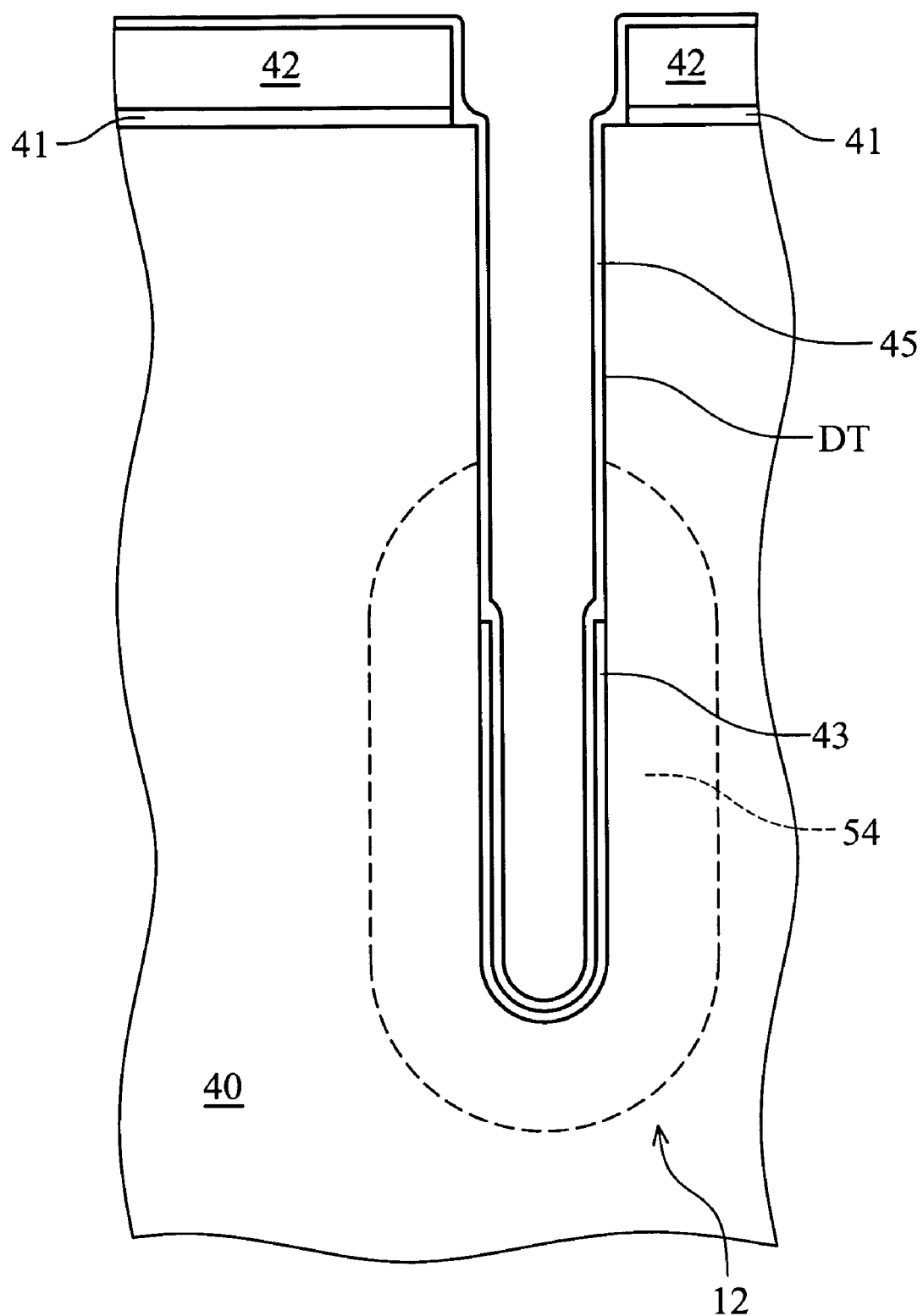
Figure 3C:
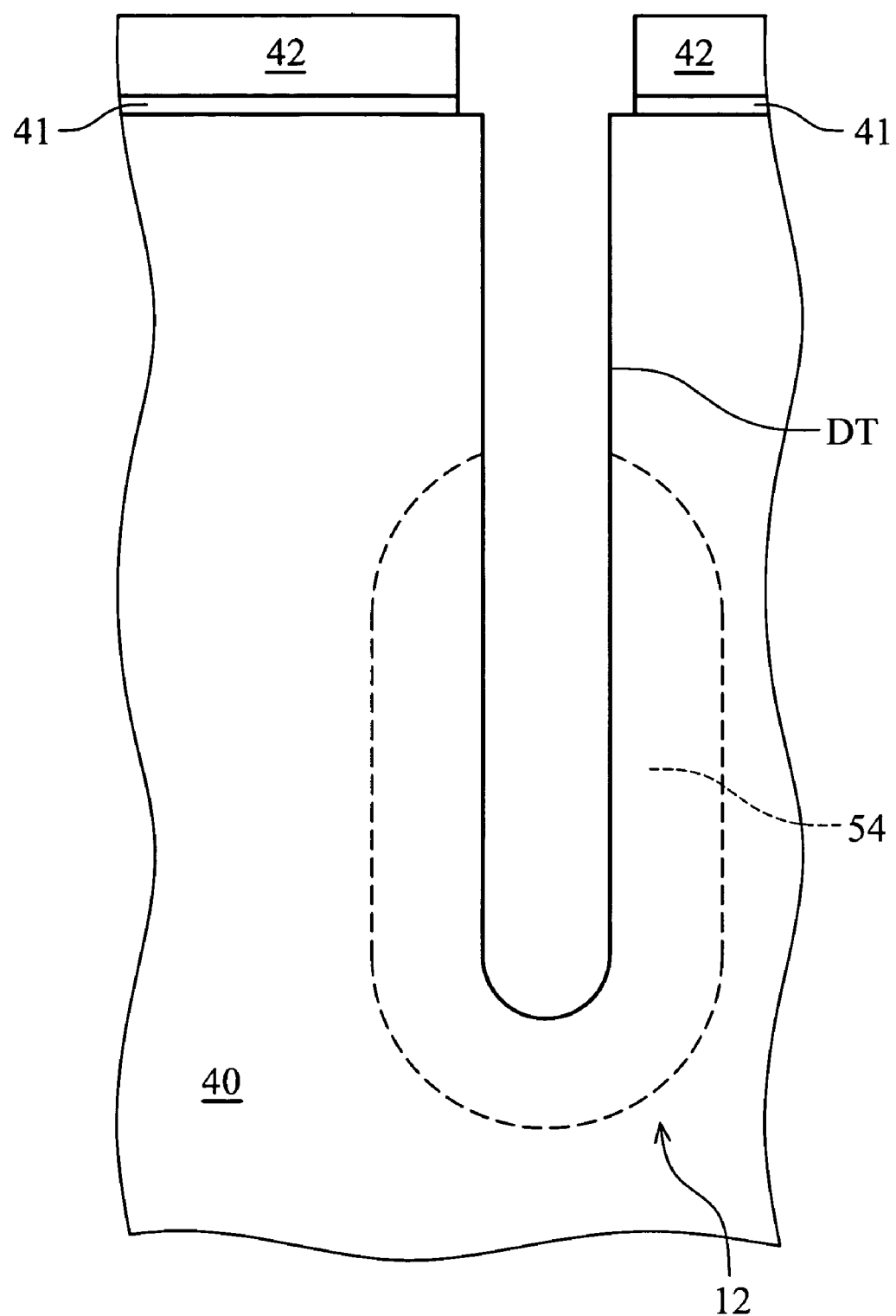

Subsequently, in FIG. 3B, using the recessed photoresist layer 44 as a mask, a portion of the ASG layer 43 on the top or the upper sidewall of the deep trench DT is removed using a wet etching, such as BHF-dip. The remained photoresist layer 44 is then removed using an acid treatment. A cap oxide layer 45, such as TEOS, is formed on the exposed surface of the deep trench DT using CVD to cap the top and the upper sidewall of the deep trench DT. A thermal process, such as annealing, is performed to diffuse $As^+$ from the ASG layer 43 to the substrate 40 near the lower portion of the deep trench DT, forming an $n^+$ diffusion area 54 to act as a buried plate. Next, in FIG. 3C, the ASG layer 43 and the cap oxide layer 45 are removed from the deep trench DT using wet etching process, such as BHF-dip+DHF, forming a bottom electrode 54.

Figure 3D:
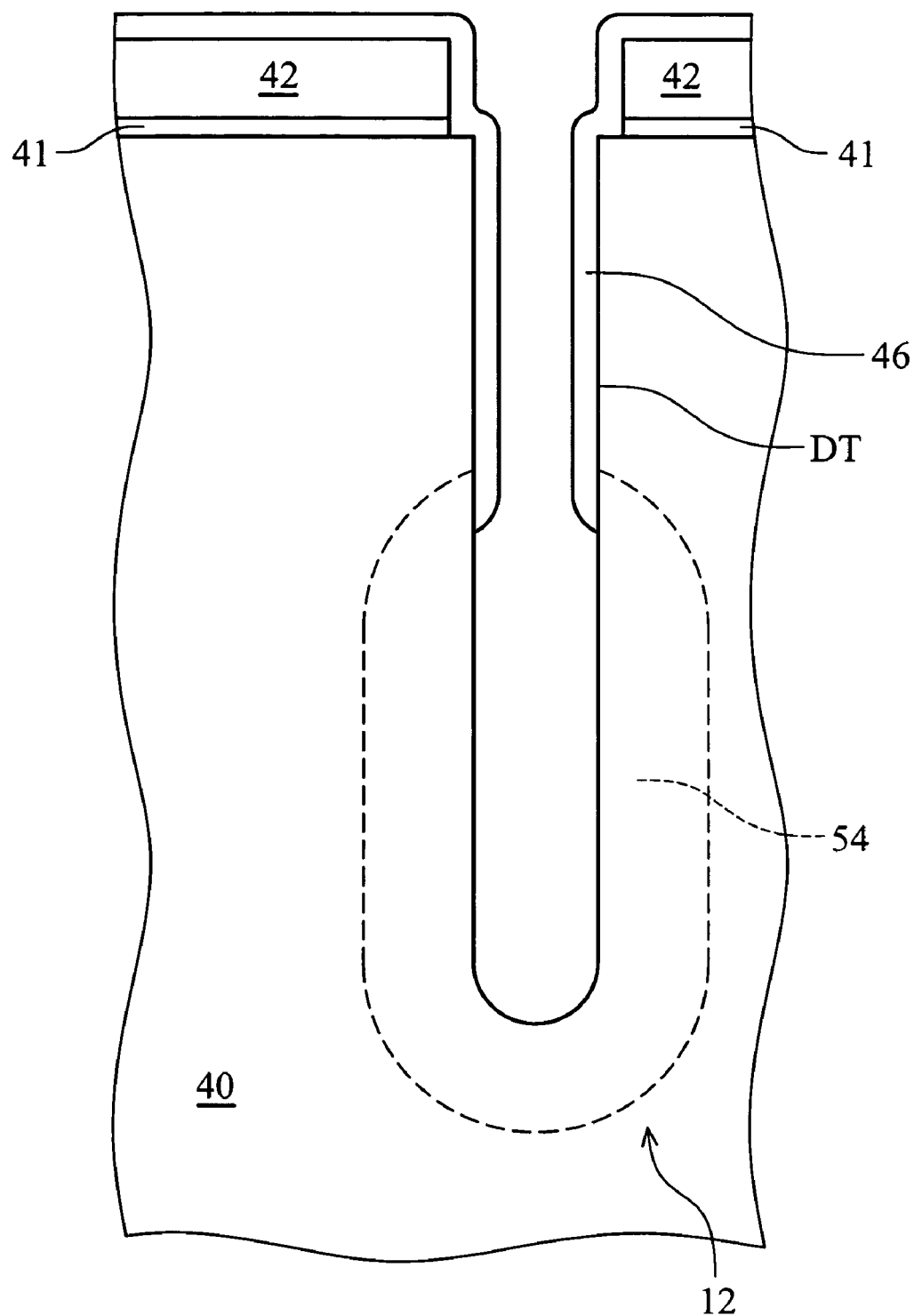

Next, in FIG. 3D, a collar dielectric layer 46, with a thickness of about 150 Å~450 Å (300 Å is optimal), is formed conformally on the top and the upper sidewall of the deep trench DT using self-starved atomic layer chemical vapor deposition (self-starved ALCVD), and controlled to a predetermined depth under the top of the deep trench DT, in about 1.5~3.5 um (2.5 um is optimal). Characteristics of the self-starved ALCVD may include controlling the precursor injection time, preferably about 100~300 msec, so that the precursor cannot reach the entire depth of the deep trench DT. The non-reactive precursor is removed using subsequently injected purge gas, such as $N_2$. By adjusting the gas flow amount and the injection time in a suitable process environment, such as for 10~15 minutes at 250~450° C. (12 minutes at 350° C. is optimal), the depth of the collar dielectric layer 46 under the top of the deep trench DT can be controlled. Prior to forming the collar dielectric layer 46 by using the self-starved ALCVD, there are no special pre-process requirements on the surface of the substrate but the HF-last wet clean process should be avoided. Generally, the standard RCA (SC1 ($NH_4OH+H_2O_2+H_2O$)+SC2 (HCL+$H_2O_2+H_2O$)) wet surface treatment process is used for 200~400 sec at 20~40° C. (for 300 sec at 35° C. is optimal) to remove the impurities, such as particles, organic or metal contaminant.

A thermal annealing process is performed at 800~1000° C./50~70 sec (900° C./60 sec is optimal) for densifying the collar dielectric layer 46 and releasing the inner stress.

Figure 3E:
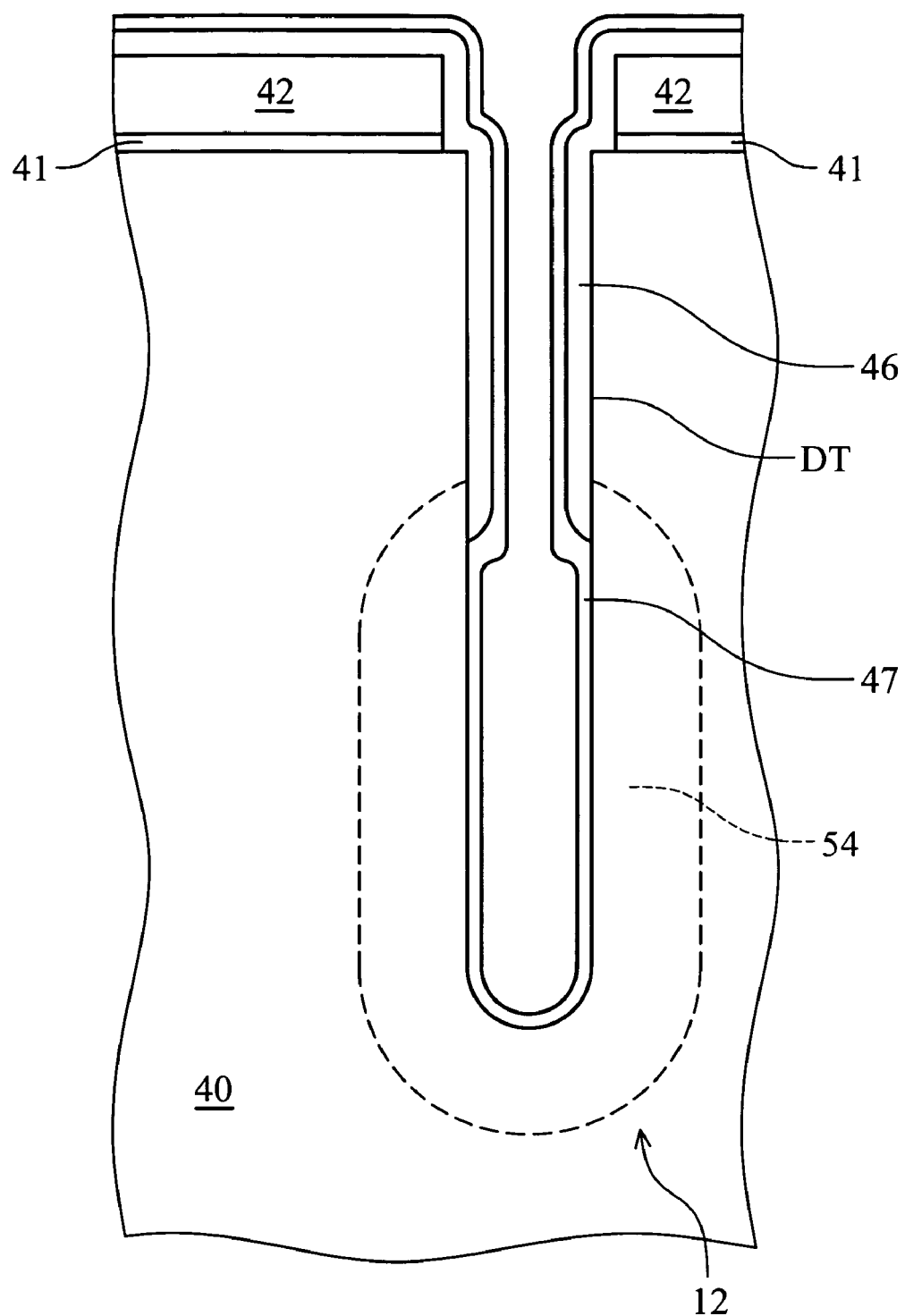

Next, in FIG. 3E, a high dielectric constant (high k) dielectric layer 47, such as $Al_2O_3$, with a thickness of about 30~70 Å (50 Å is optimal), is formed on the collar dielectric layer 46 using ALCVD, at 3~8 minutes/400~450° C. (5 minutes/420° C. is optimal), and extends to the lower and the bottom sidewall of the deep trench DT, acting as the capacitor material to replace the conventional NO dielectric layer structure. Generally, dielectric materials higher than 3.9 are defined as high k materials. $Al_2O_3$ with a dielectric constant as 8~12 is used in the embodiment. The high k dielectric material is not able to be formed using conventional CVD, but the film formed using ALCVD gets not only the high dielectric constant but also the 100% step coverage and excellent film uniformity. Furthermore, the high k dielectric material provides good thermal stability such that the high k dielectric material would not easily be damaged by subsequent thermal process. In addition, $Al_2O_3$ could present very low current leakage, fitting the criteria of the DRAM. While this embodiment invention uses high k dielectric materials to act as a capacitor dielectric layer, it is not restricted thereto, NO or ONO dielectric structure suitable.

Figure 3F:
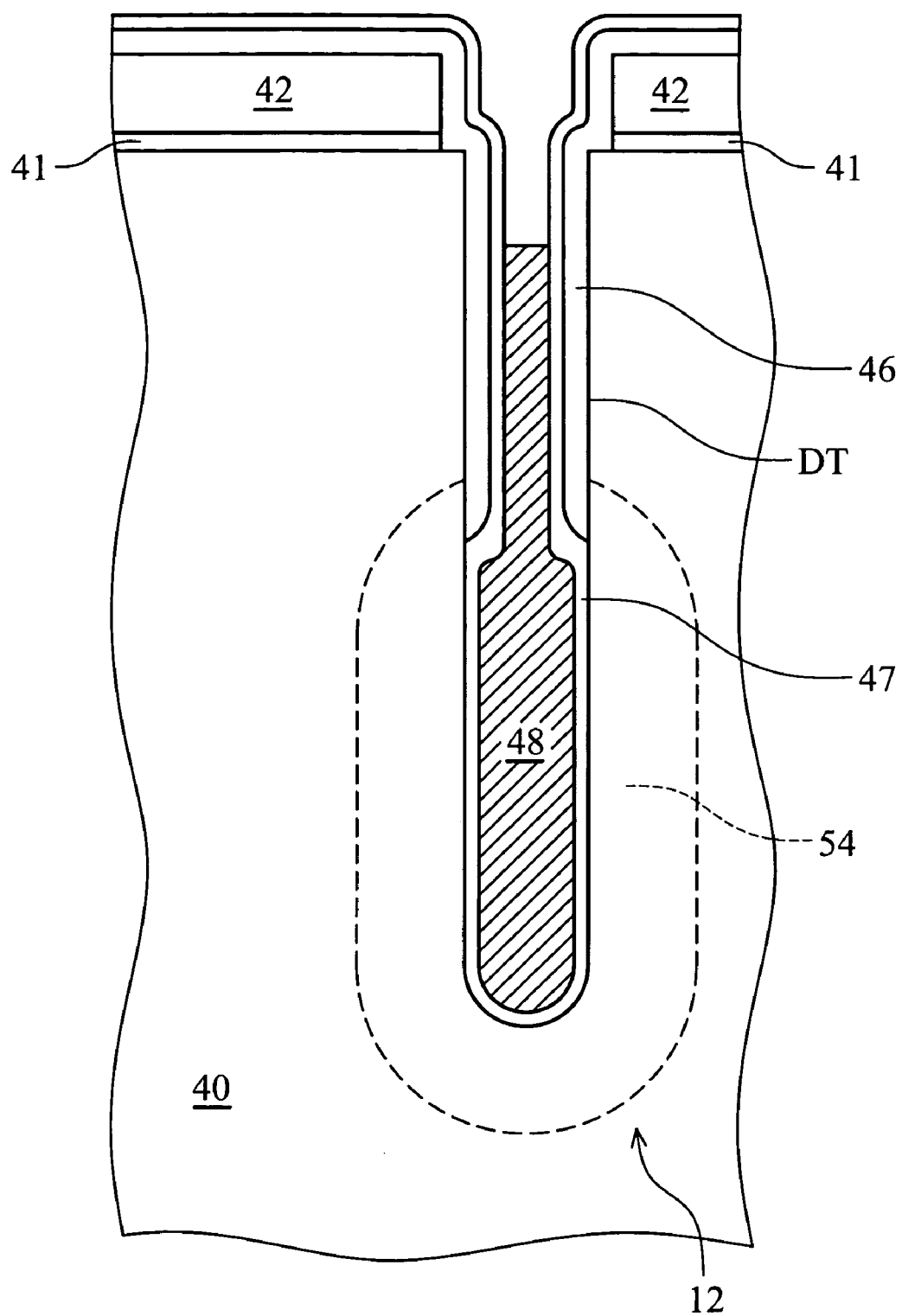
Figure 3G:
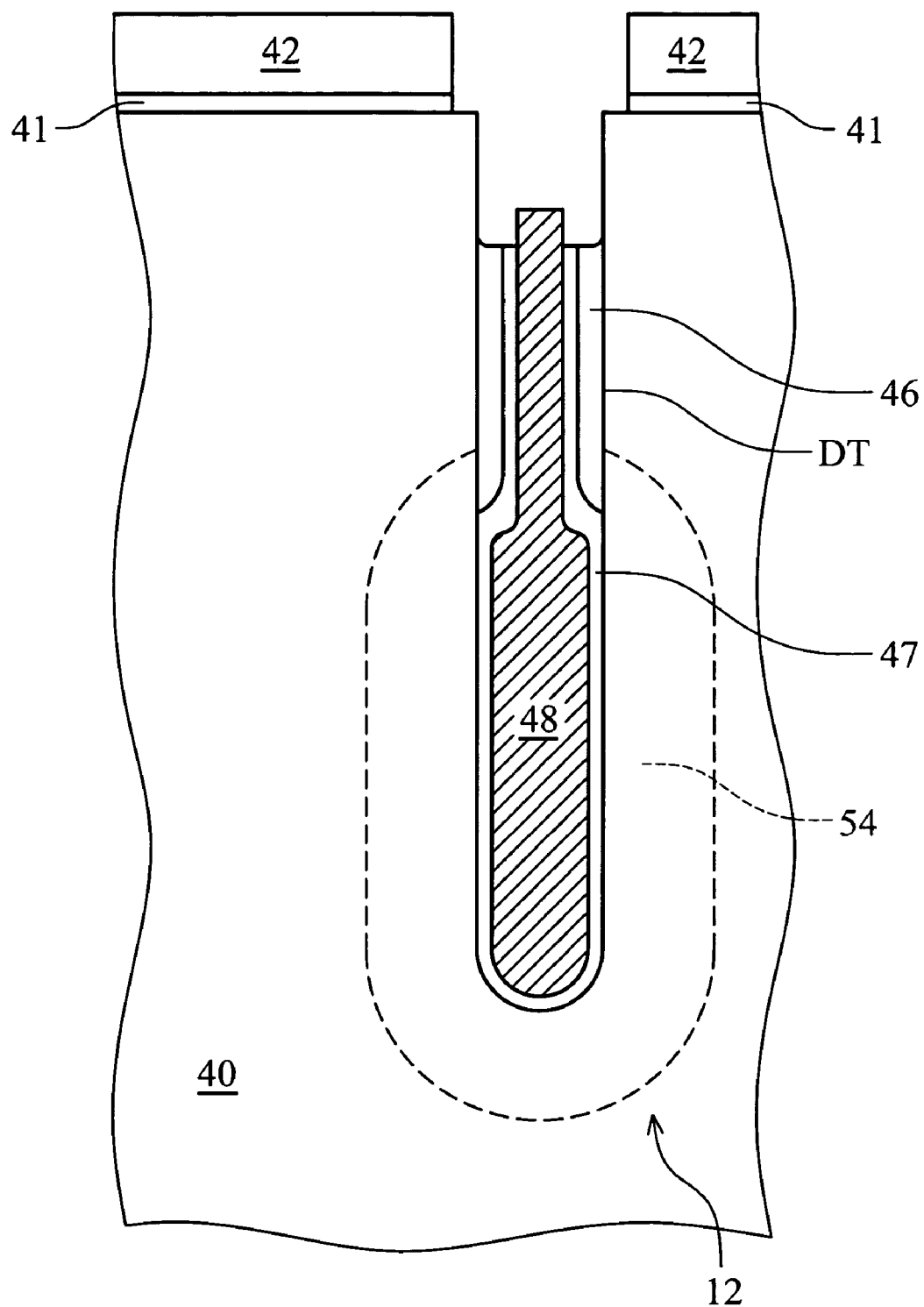

Next, in FIG. 3F, a conductive layer 48, such as a doped polysilicon layer with a thickness of about 2500 Å~3500 Å (3000 Å is optimal), is filled into the deep trench DT using low pressure chemical vapor deposition (LPCVD), at 530~620° C. (550° C. is optimal),and recessed to a predetermined depth for forming a top electrode. Finally, in FIG. 3G, a portion of the high k dielectric layer 47 and the collar dielectric layer 46 on the sidewall of the deep trench are removed using a wet etching, such as $H_3PO_4$ etching, at 150~200 sec, 120~180° C. (180 sec/155° C. is optimal).

The method of the embodiment comprises forming the collar dielectric layer 46 using ALCVD before filling the conductive layer 48, and therefore could eliminate process steps and reduce the cost thereof.

SECOND EMBODIMENT

Figure 4A:
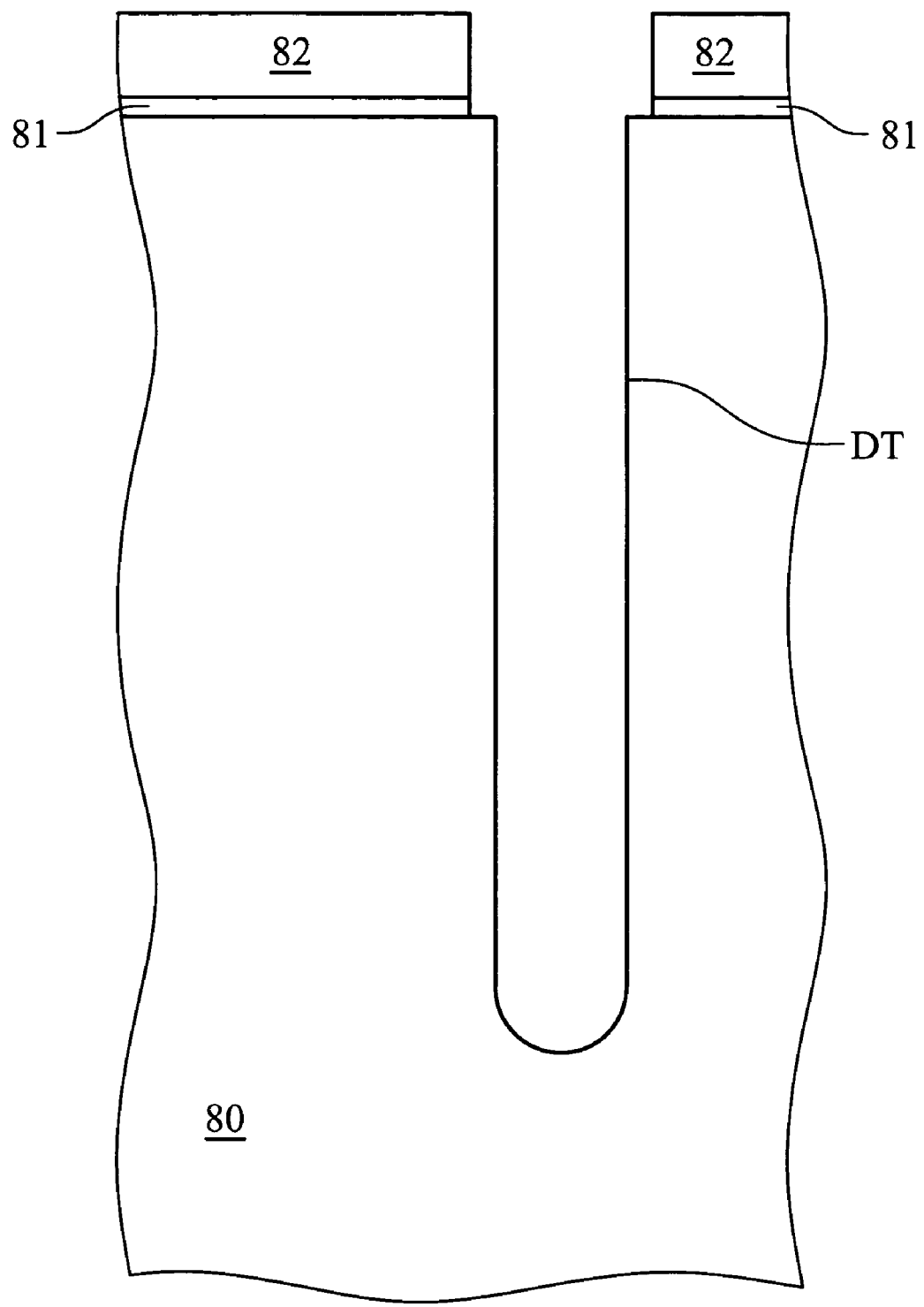
FIG. 4A~4F illustrate process steps for fabricating a trench capacitor of another embodiment of the invention.
Figure 4B:
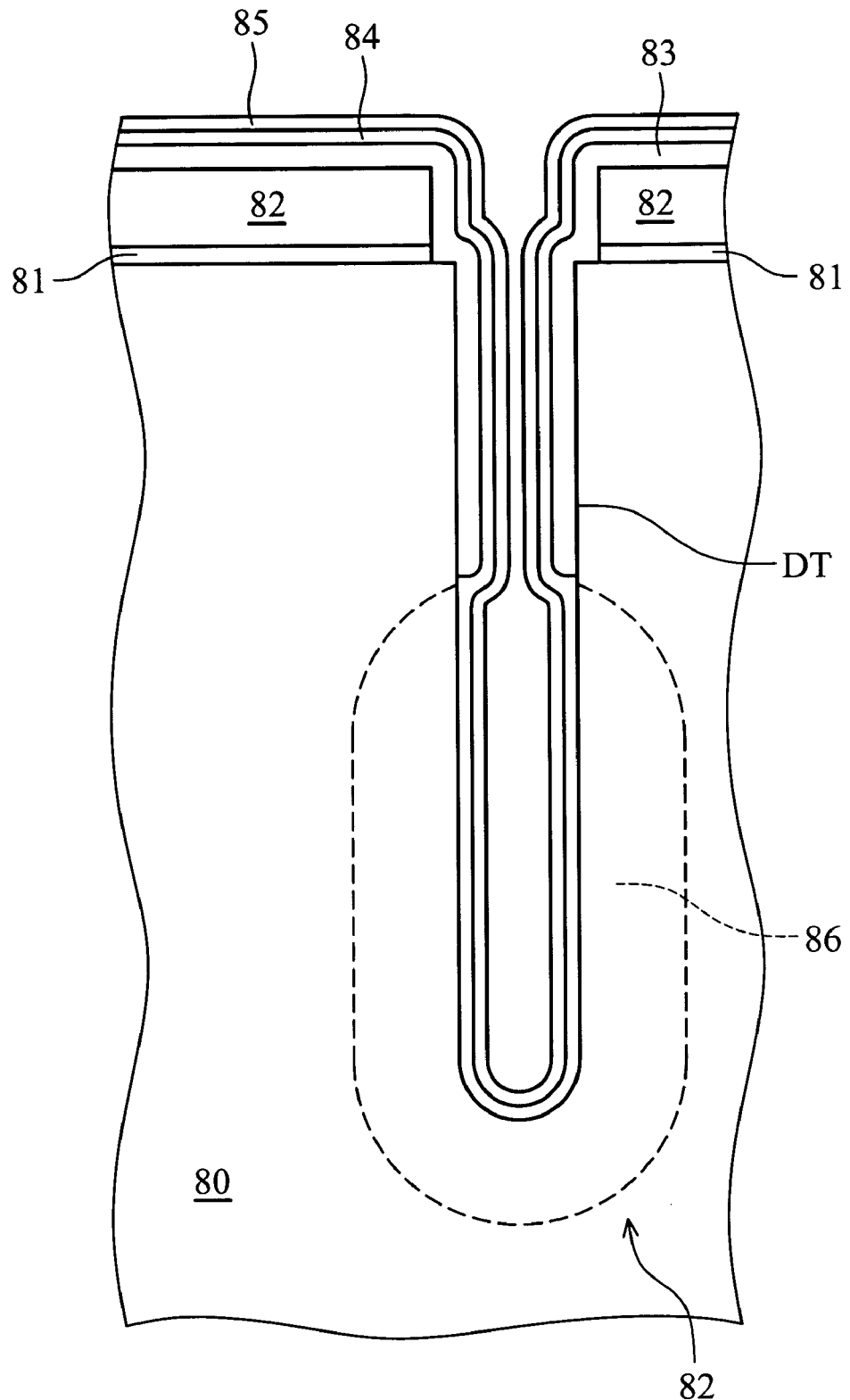

In FIG. 4A, a semiconductor substrate 80 is provided having a pad oxide layer 81, a pad nitride layer 82 and a deep trench DT thereon. In FIG. 4B, a diffusion barrier layer 83, with a thickness of about 150 Å~450Å, preferably comprising silicon nitride or silicon oxynitride, is formed conformally on the top and the upper sidewall of the deep trench DT using self-starved atomic layer chemical vapor deposition (self-starved ALCVD), and held to a predetermined depth of about 1.5~3.5 um (2.5 um is optimal) under the top of the deep trench DT. Characteristics of the self-starved ALCVD may include controlling the precursor injection time, preferably about 100~300 msec, so that the precursor cannot reach the entire depth of the deep trench DT. The non-reactive precursor is removed using subsequently injected purge gas, such as $N_2$. By adjusting the gas flow amount and the injection time in a suitable process environment, such as for 10~15 minutes at 250~450° C. (12 minutes at 350° C. is optimal), the depth of the diffusion barrier layer 83 under the top of the deep trench DT can be controlled. Prior to forming the diffusion barrier layer 83 by using the self-starved ALCVD, there are no special pre-process requirements on the surface of the substrate but the HF-last wet clean process should be avoided. Generally, the standard RCA (SC1($NH_4OH+H_2O_2+H_2O$)+SC2($HCL+H_2O_2+H_2O$)) wet surface treatment process is used for 200~400 sec at 20~40° C. (for 300 sec at 35° C. is optimal) to remove the impurities, such as particles, organic or metal contaminant.

A doped oxide layer 84, such as ASG, is conformally deposited on the diffusion barrier layer 83 and on the sidewall of the deep trench DT using a low pressure chemical deposition method (LPCVD). A cap layer 85, for example a cap TEOS, is in-situ formed on the doped oxide layer 84. A thermal process, such as annealing, is performed to diffuse $As^+$ into a portion of the substrate 80 near the lower portion of the deep trench DT, forming a diffusion area 86 to act as a buried plate. Next, in FIG. 4C, the doped oxide layer 84 and the cap layer 85 are removed from the deep trench DT using a wet etching process, such as BHF-dip+DHF. Subsequently, in FIG. 4D, the diffusion barrier layer 83 is removed by a selective etching process. Due to the diffusion barrier layer 83 is made of the ALCVD silicon nitride layer, the selective etching process with high etching rate for silicon nitride layer could reduce the undercut occurring at the pad oxide layer 81 for preventing the film from peeling.

Figure 4C:
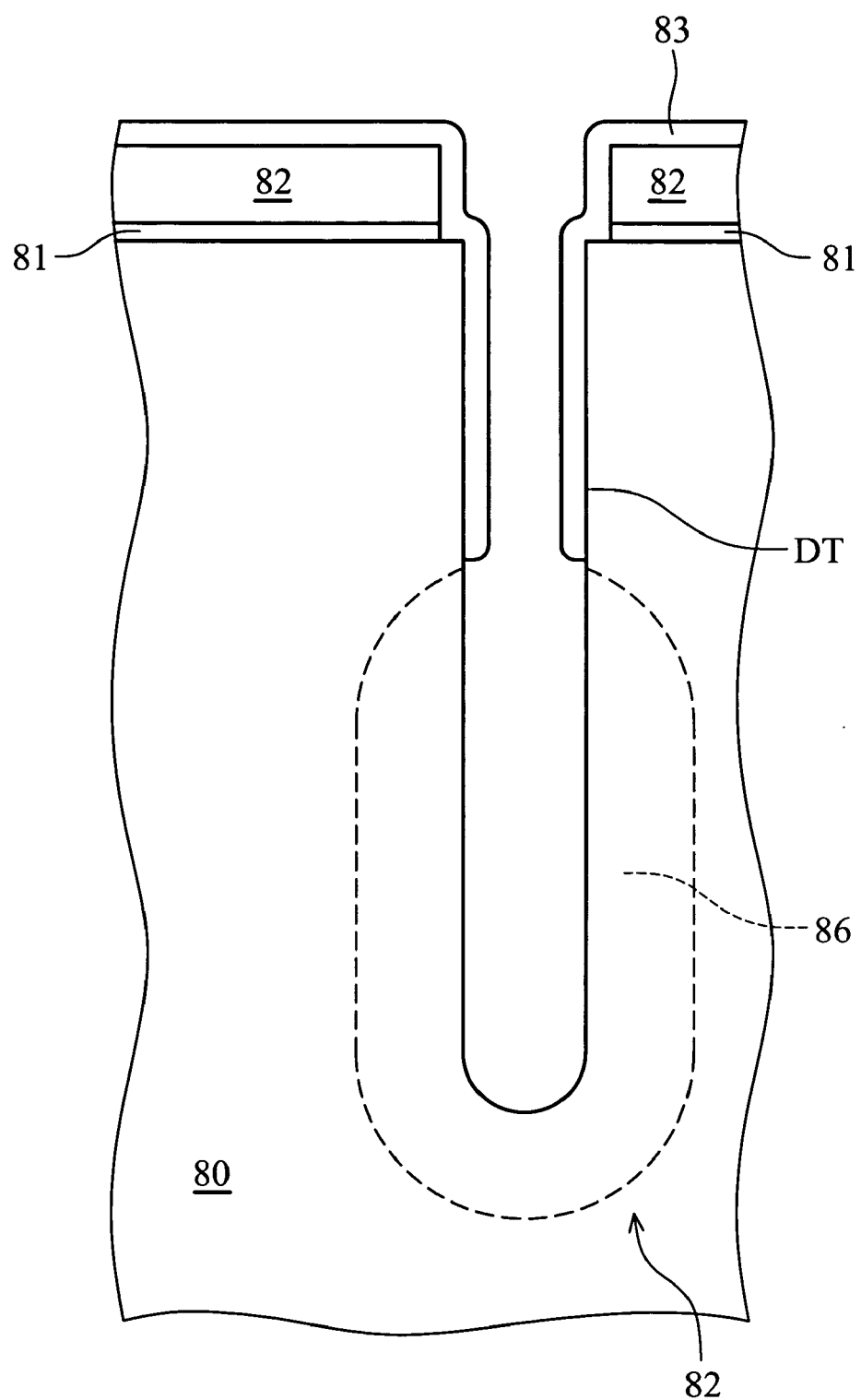
Figure 4D:
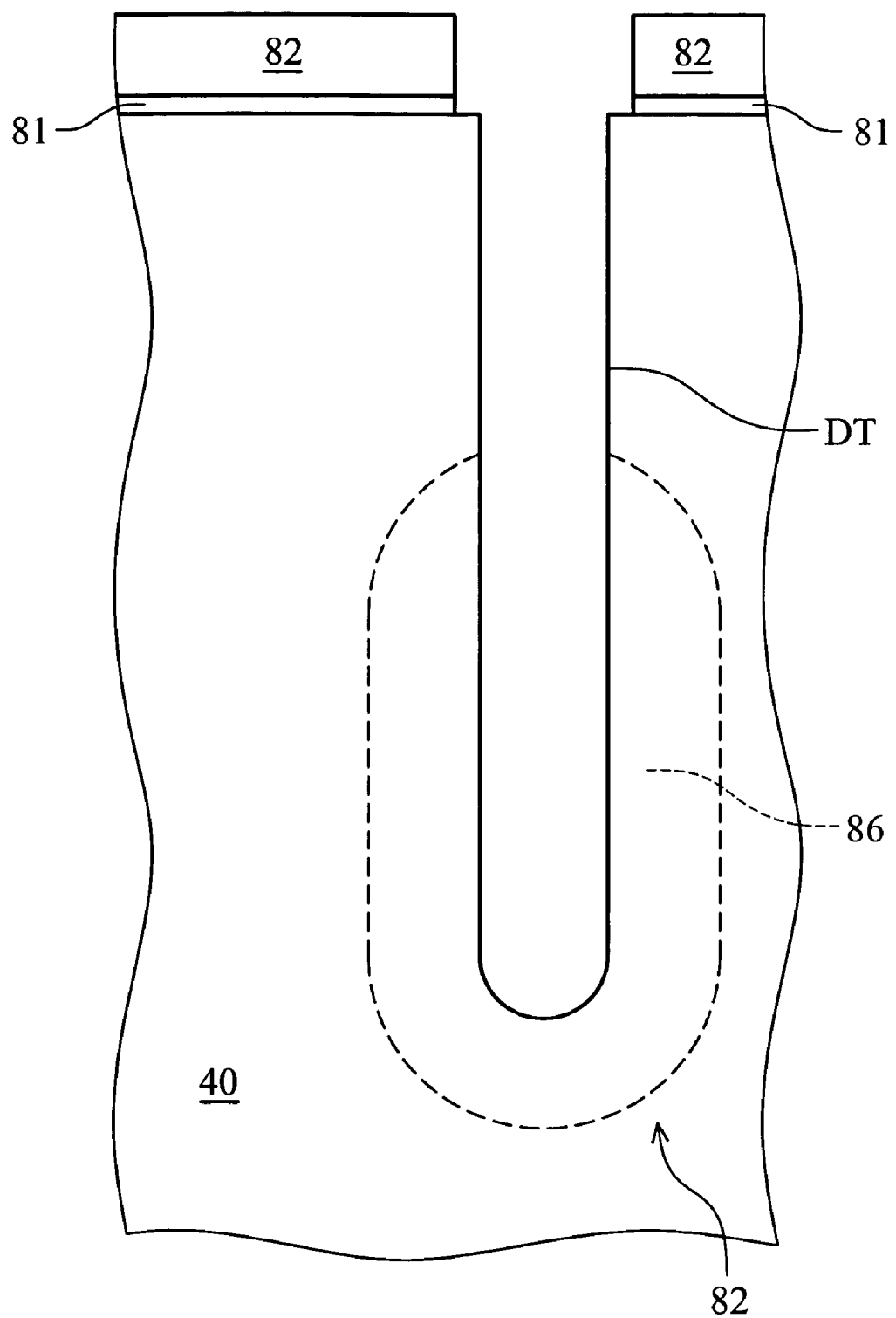
Figure 4E:
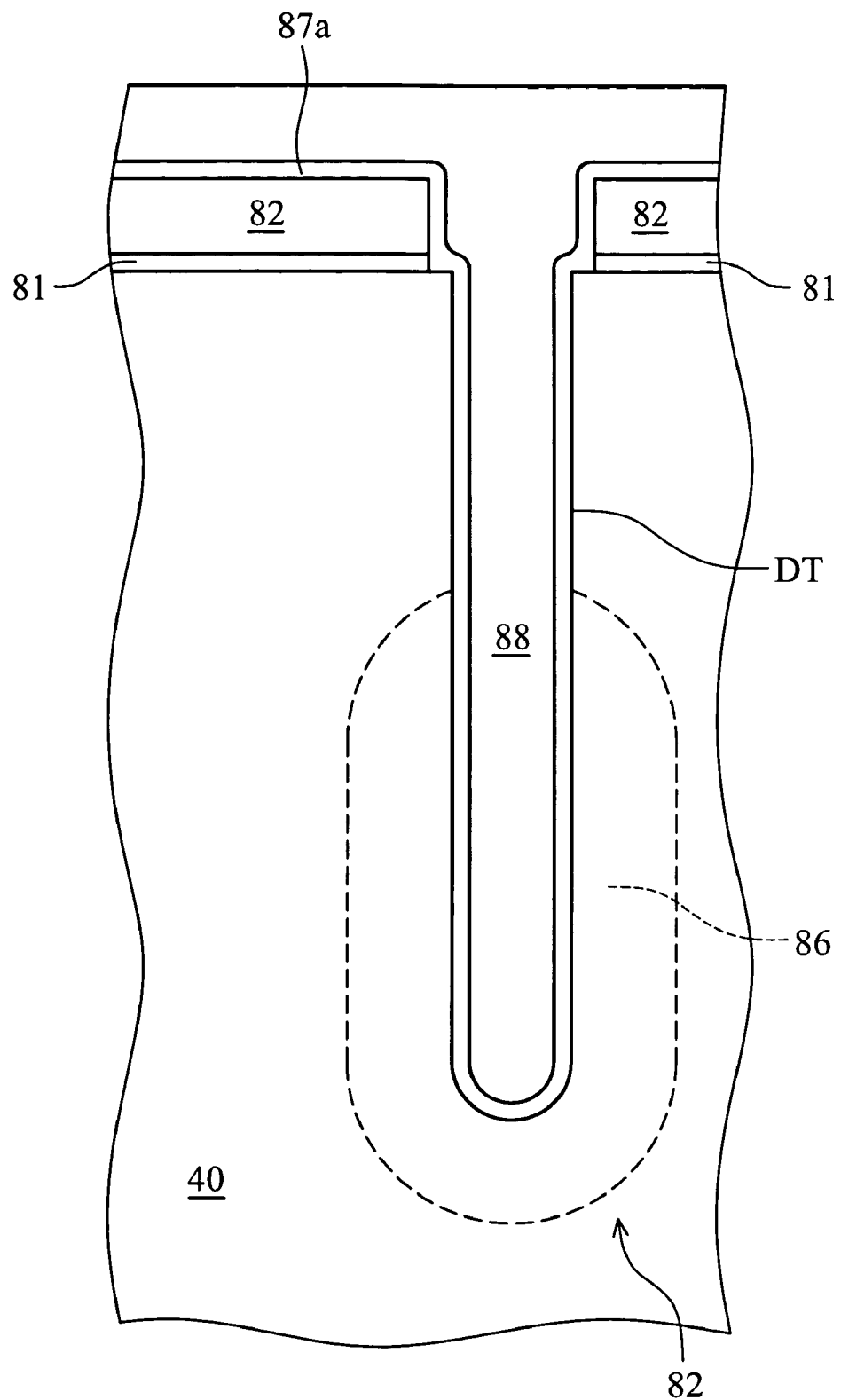

In FIG. 4E, a high k capacitor dielectric layer 87a, such as silicon oxide, silicon nitride, or the combination thereof, is formed on the sidewall of the trench. Generally, a dielectric material is defined to be high k if the dielectric constant is higher than 3.9. Afterward, an n-type doped conductive layer 88, such as a polysilicon layer is filled in the deep trench DT using low pressure chemical vapor deposition (LPCVD), at a temperature such as 530~620° C. (550° C. is optimal), with a thickness of about 2500~3500 Å (3000 Å is optimal).

Figure 4F:
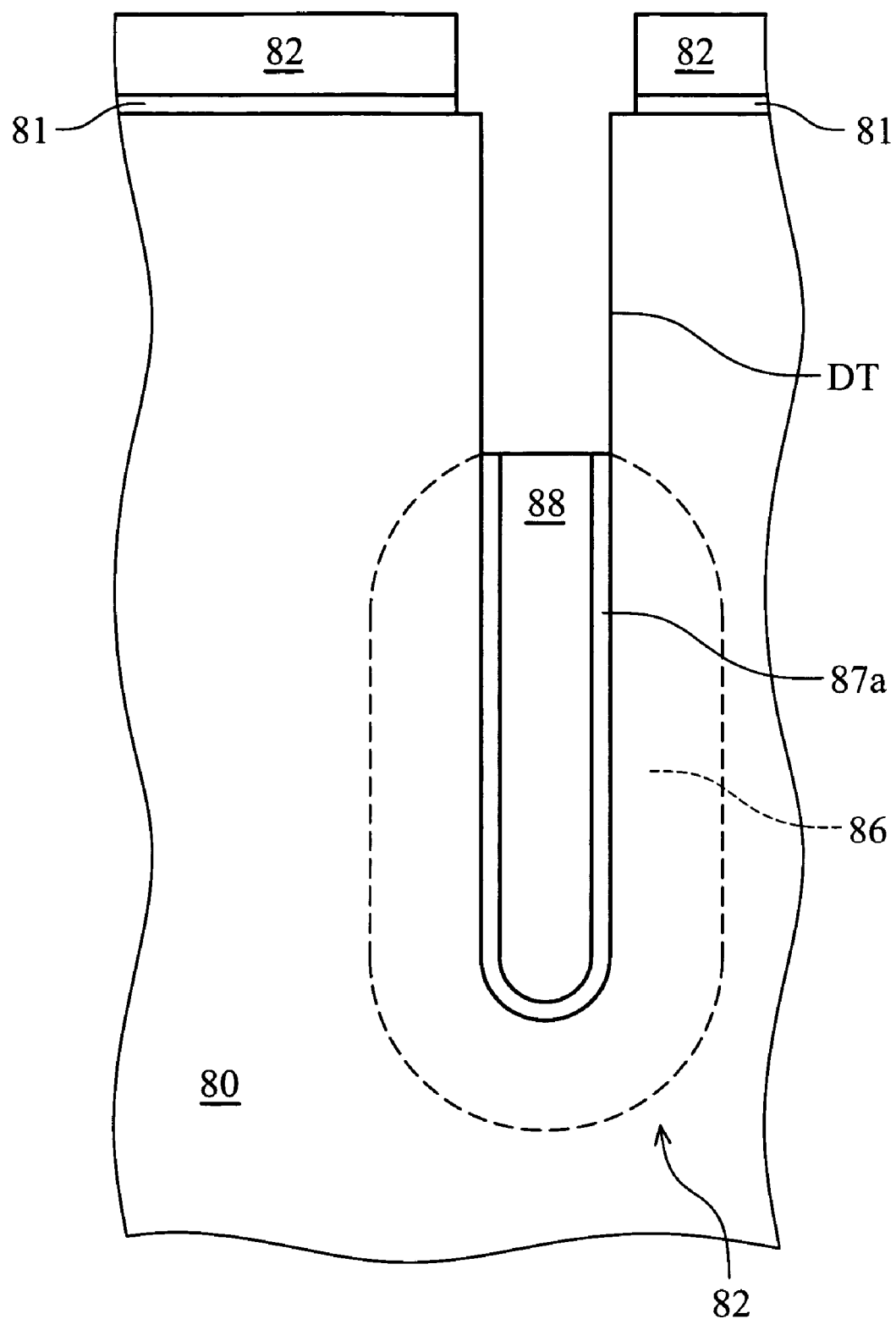

Finally, in FIG. 4F, the n-type doped conductive layer 88 is recessed to a predetermined depth to act as a storage node of the deep trench capacitor. A portion of the capacitor dielectric layer 87 on the sidewall of the deep trench is removed using wet etching, such as $H_3PO_4$, at 150~200 sec, 120~180° C. (180 sec/155° C. is optimal).

Figure 1A:
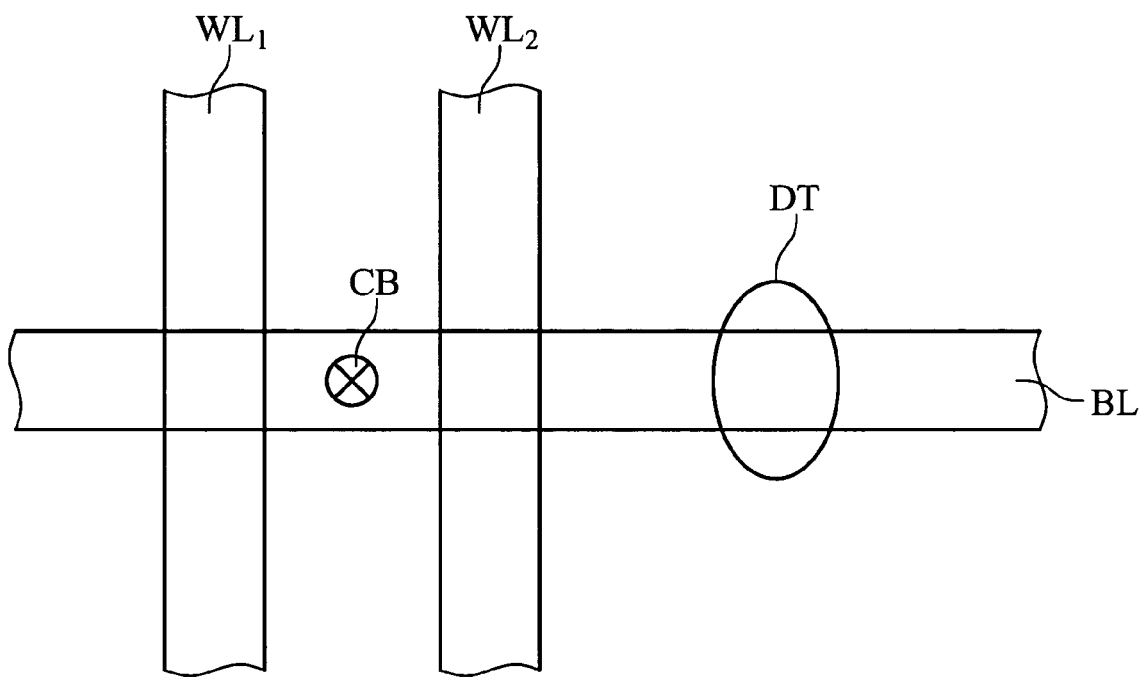
FIG. 1A is a plane view of a conventional deep trench of a DRAM cell.
Figure 1B:
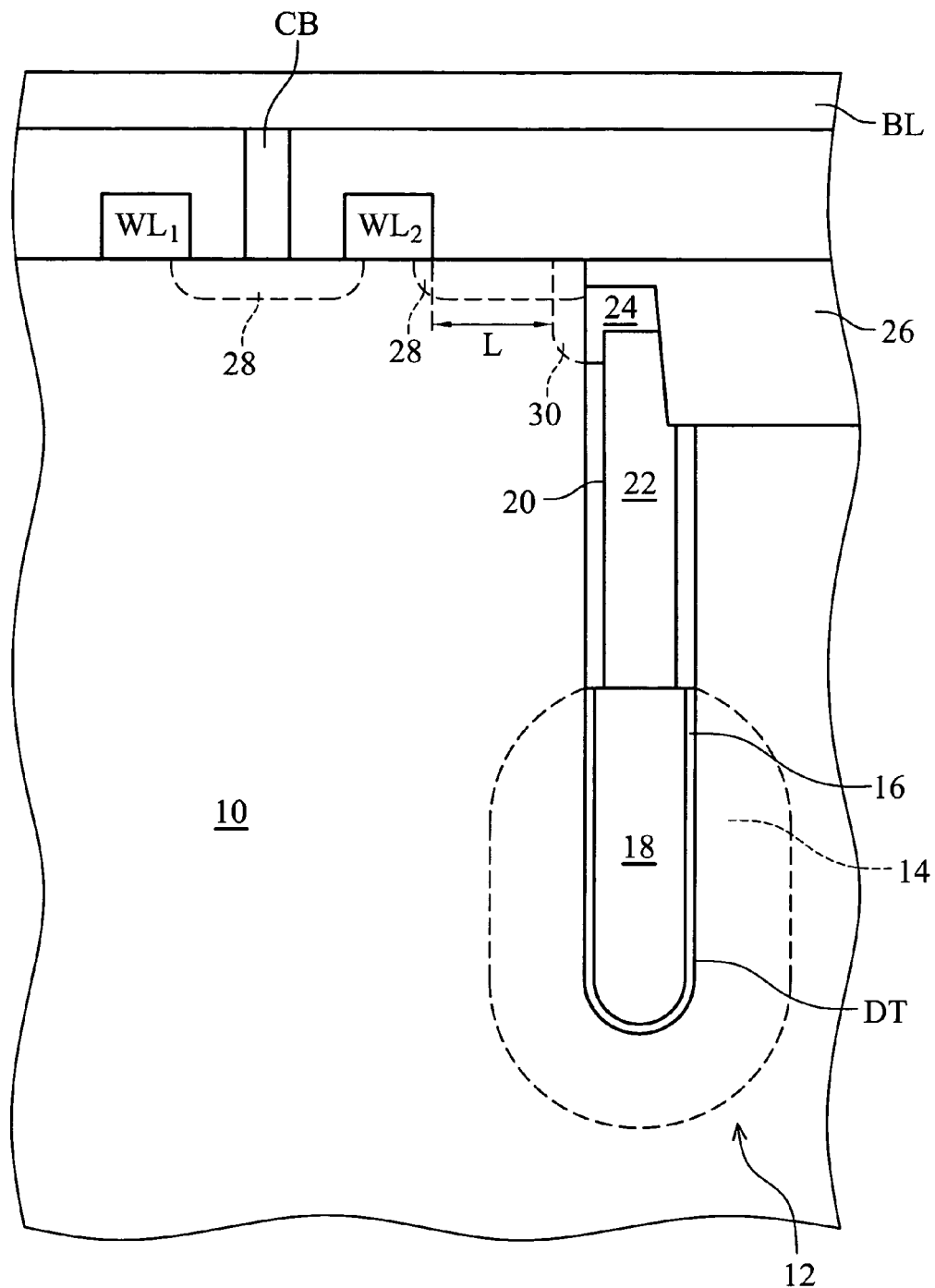
FIG. 1B is a cross section of a conventional deep trench capacitor of a DRAM cell.
Figure 2A:
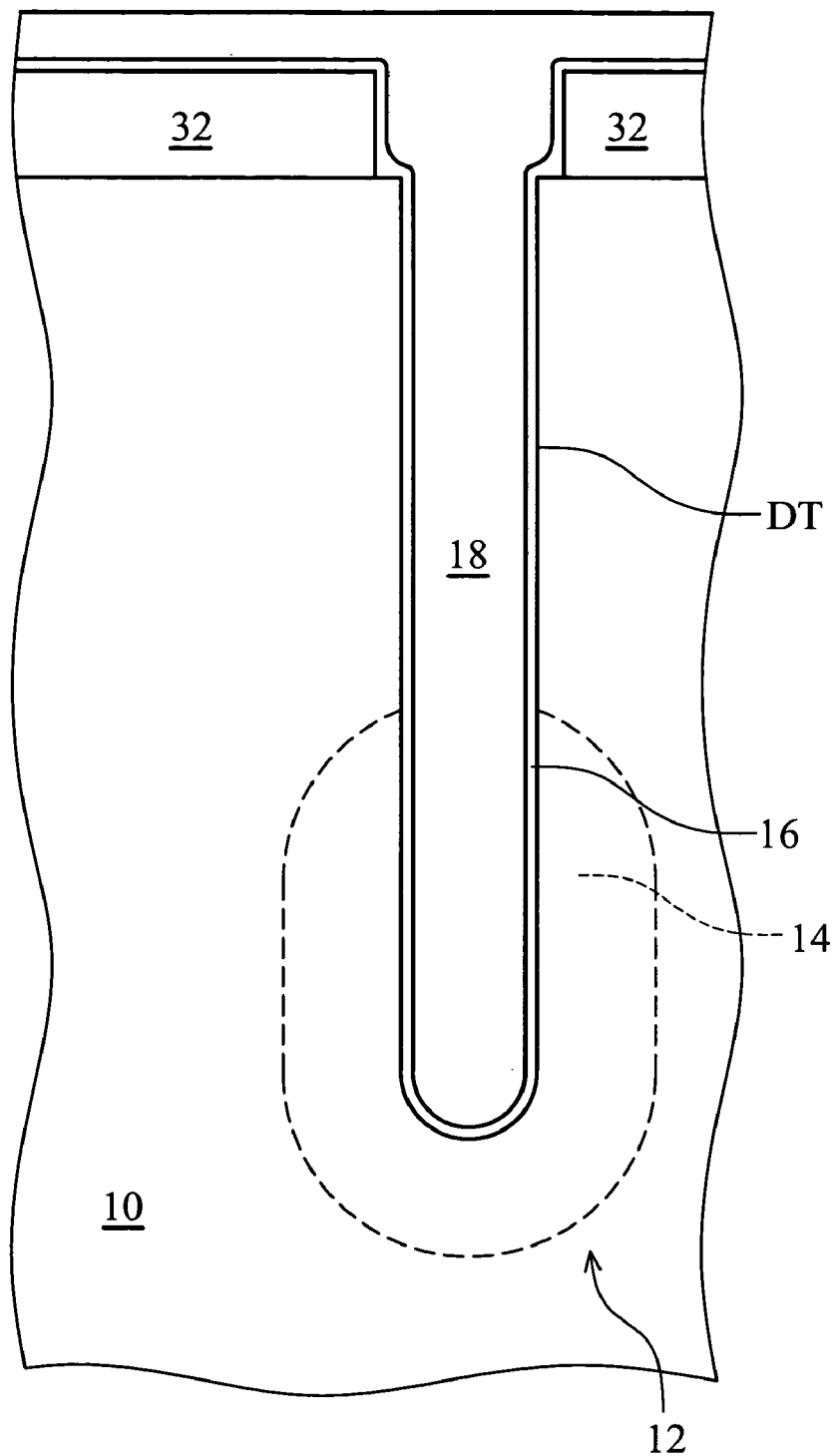
FIG. 2A~2E are cross sections of fabrication of a conventional deep trench capacitor.
Figure 2B:
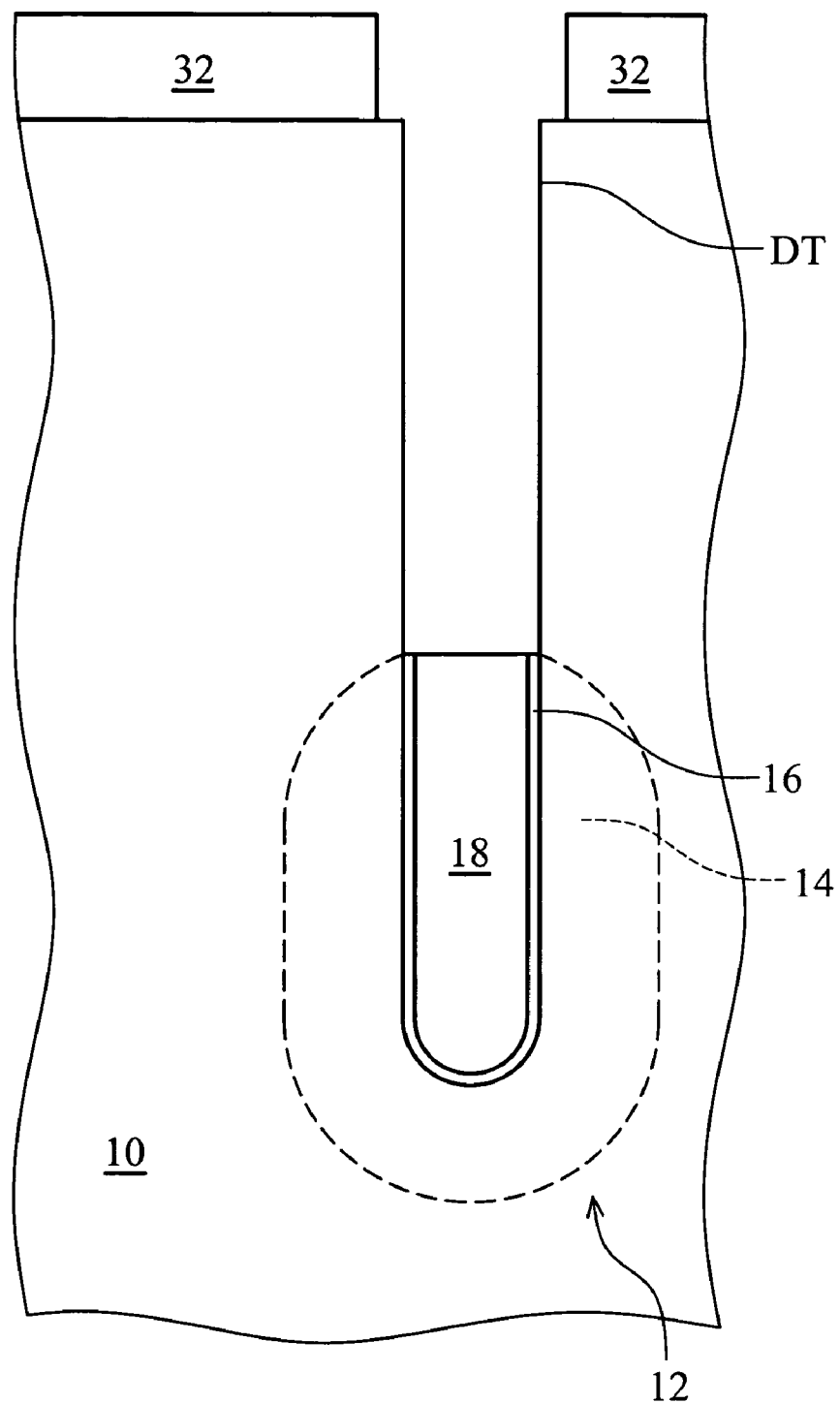
Figure 2C:
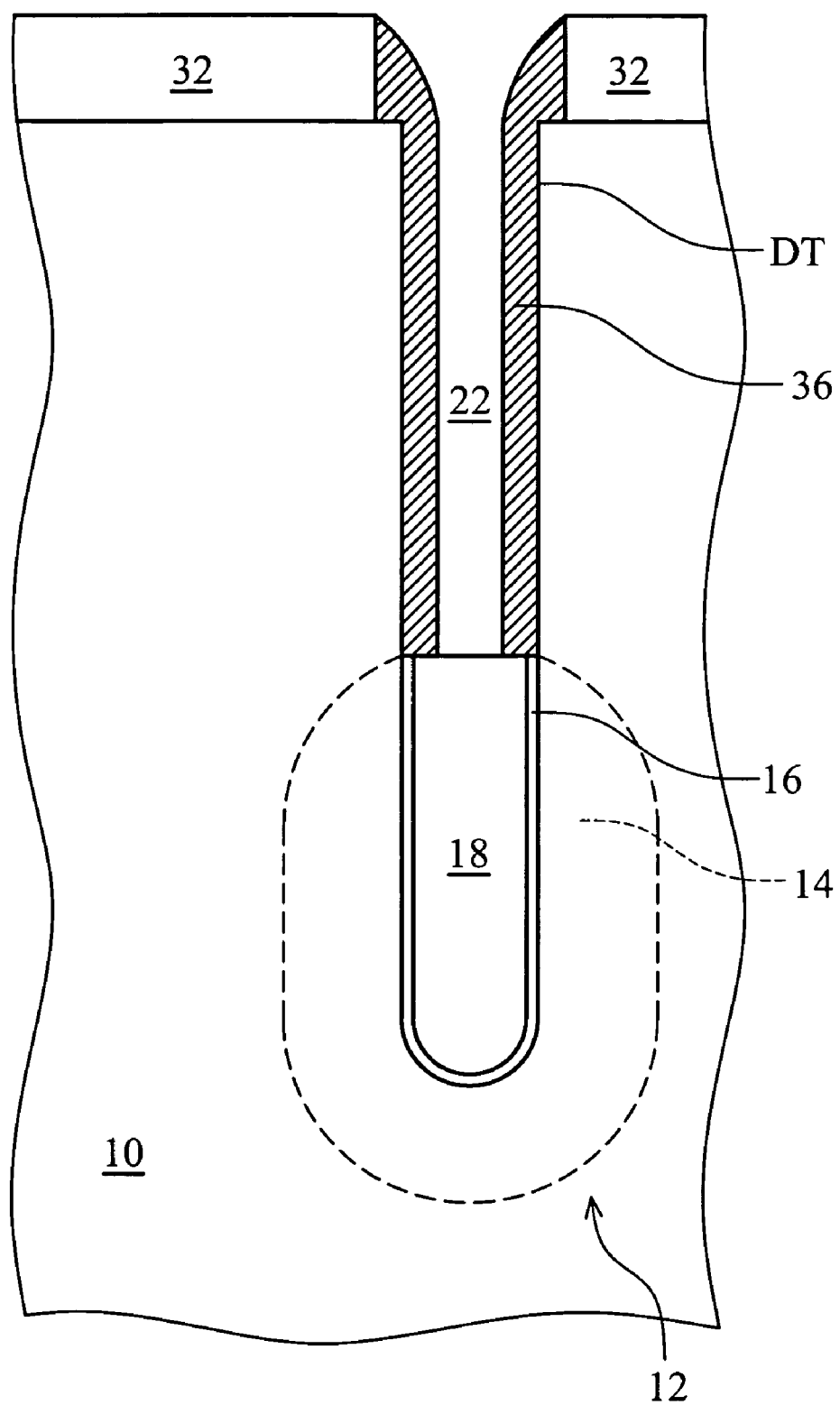
Figure 2D:
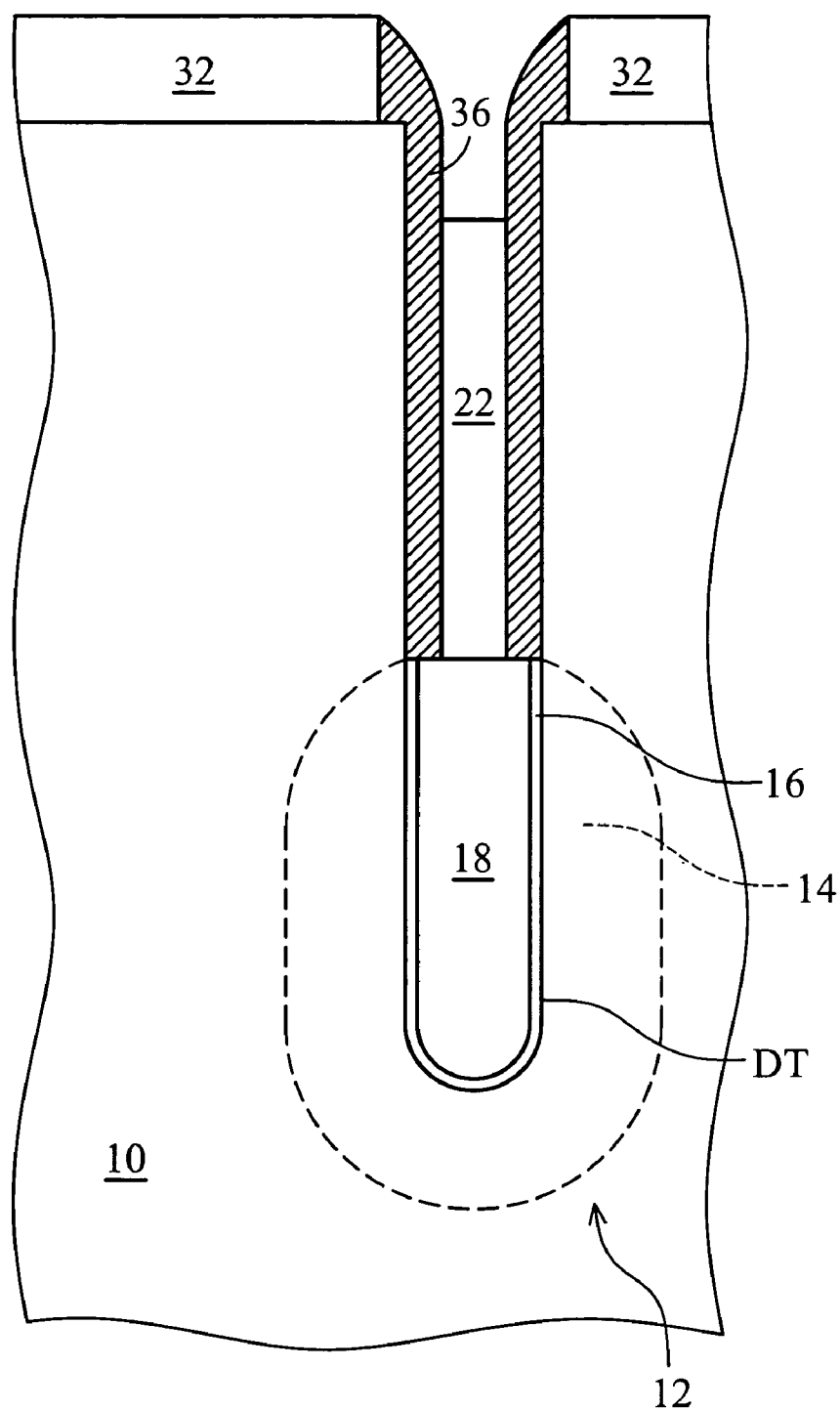
Figure 2E:
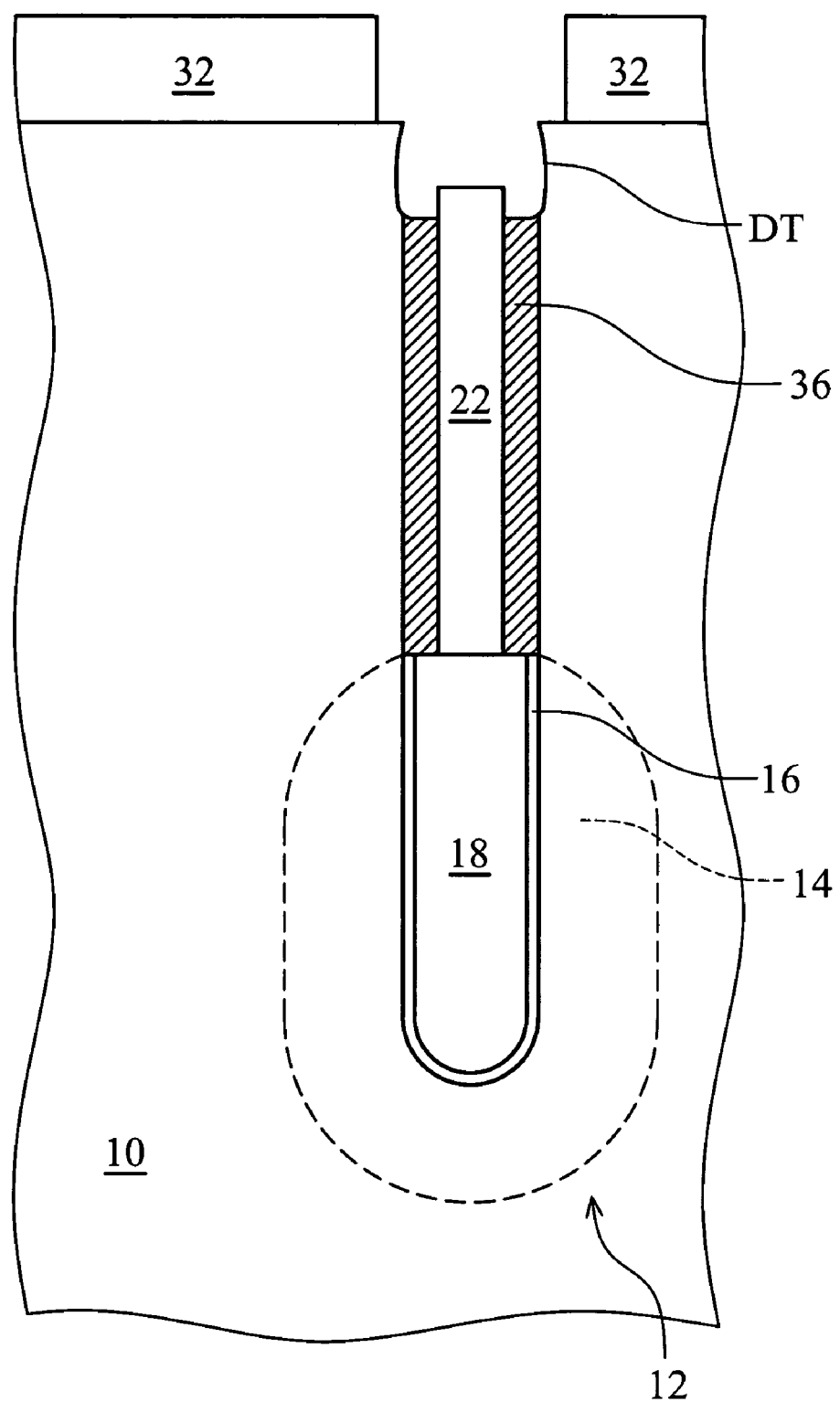

Furthermore, a silicon collar dielectric layer and an $n^+$-type doped second conductive layer could be formed in the deep trench DT in sequence, as shown in FIG. 2C and FIG. 2D respectively.

While this embodiment invention uses conventional process to form the silicon collar oxide layer and the conductive layers, it is not restricted thereto. When the second embodiment compared with the conventional process for forming the buried plate of the deep trench capacitor, at least the steps of coating the photoresist layer, recessing the photoresist layer, removing the upper portion of the ASG layer, and removing the photoresist layer could be eliminated. Additionally, further another embodiment of the invention can be provided by combining the first embodiment and the second embodiment. The N+ diffusion area 54 in FIG. 3D of the first embodiment is formed using the method of the second embodiment. The diffusion barrier layer 83 of the second embodiment could act as the collar dielectric layer 46 of the first embodiment, and then the steps of forming the high dielectric constant (high k) dielectric layer 47, depositing the conductive layer 48, recessing the conductive layer 48, and recessing the portion of the high k dielectric layer 47 and the collar dielectric layer 46 are performed in sequence as described in the first embodiment.

As well, in FIGS. 4A~4C, a semiconductor substrate 80 comprising a deep trench DT is provided. A diffusion barrier layer 83 is formed on a portion of the sidewall of the deep trench using ALCVD. A doped oxide layer 84 is formed on the sidewall of the deep trench and on the diffusion barrier layer 84. A cap layer 85 is formed on the doped layer 84, which is annealed to form an N+ diffusion area 86 serving as a bottom electrode of a capacitor subsequently. The cap layer 85 and the doped layer 84 in the trench are then removed using a wet etching process. The wet etching process in this step could be combined with the subsequent pre-clean process for depositing capacitor dielectric layer to reduce the process steps.

Referring to FIGS. 3D~3G, subsequent to formation of the N+ diffusion area 86, a high dielectric constant dielectric layer 47 is conformally deposited on the collar dielectric layer 46 (i.e. the diffusion barrier layer 83 in FIG. 4C) and extends to the bottom and sidewall of the trench, acting as a dielectric material of a deep trench capacitor. A conductive layer 48 is filled in the trench, and recessed to a predetermined depth, acting as a top electrode of the deep trench capacitor. A portion of the high dielectric constant dielectric layer 47 and collar dielectric layer 46 is removed using the conductive layer 48 as a mask.

The embodiment of the invention forms a diffusion barrier layer with ALCVD in a portion of a trench, thus reducing process steps, and costs are reduced thereof. Furthermore, the diffusion barrier layer formed with ALCVD could act as a collar dielectric layer, further reducing process steps.

A characteristic of the above-mentioned embodiments includes forming a dielectric layer with a predetermined depth using self-starved ALCVD to act as either a diffusion barrier layer or a collar dielectric layer. A high k node dielectric layer, such as $Al_2O_3$, of the trench capacitor could also be formed by self-starved ALCVD for increasing the electrical capacitance. In addition, the film formed using ALCVD gets not only the high dielectric constant but also the 100% step coverage and excellent film uniformity.

In the prior arts, the first polysilicon layer, the collar oxide layer, and the second polysilicon layer are formed in the trench in sequence. The method of the above-mentioned embodiments comprises a formation of the collar oxide layer prior to formation of polysilicon layer, thus at least eliminating the one step of forming polysilicon layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of thee appended claims should be accorded the broadest interpretation so as to encompass all such modifications and similar arrangements.

What is claimed is:

1. A method of forming trench capacitor comprising the steps of:
   providing a silicon substrate having a deep trench and a pad structure, wherein a buried plate is formed in the silicon substrate adjacent to the trench;
   forming a collar dielectric layer conformably on a top surface and a sidewall of the pad structure and a upper sidewall of the trench;
   forming a high dielectric constant (high k) dielectric layer conformably covering the collar dielectric layer and extending to a bottom and a lower sidewall of the trench as a capacitor dielectric layer;
   filling a conductive layer into the trench, and recessing the conductive layer to a predetermined depth to act as a top electrode; and
   removing a portion of the high k dielectric layer and a portion of the collar dielectric layer on the sidewall of the trench using the conductive layer as a mask,
   wherein the collar dielectric layer is formed using self-starved atomic layer chemical vapor deposition (self-starved ALCVD).

2. The method of claim 1, wherein the collar dielectric layer is a silicon oxide ($SiO_2$) layer.

3. The method of claim 1, further comprising, before forming the collar dielectric layer using self-starved ALCVD, performing a surface treatment.

4. The method of claim 3, wherein the surface treatment is a standard RCA cleaning process.

5. The method of claim 1, wherein the depth of the collar dielectric layer is 1.5~3.5 um from the top of the trench.

6. The method of claim 1, wherein the high dielectric constant dielectric layer is formed using atomic layer chemical vapor deposition (ALCVD).

7. The method of claim 6, wherein the high dielectric constant dielectric layer is an $Al_2O_3$ layer.

8. The method of claim 6, wherein a thickness of the high dielectric constant dielectric layer is 30~70 Å.

9. The method of claim 1, wherein a portion of the high dielectric constant dielectric layer and the collar dielectric layer on the sidewall surface of the trench are removed using wet etching process.

10. A method of forming trench capacitor comprising the steps of:
    providing a substrate having a trench and a buried plate, wherein the buried plate is formed in the substrate adjacent to the trench;
    forming a collar dielectric layer on the top sidewall of the trench;
    forming a dielectric layer covering the collar dielectric layer and extending to the bottom and the lower sidewall of the trench to act as a capacitor dielectric layer;
    filling a conductive layer in the trench, and recessing the conductive layer to a predetermined depth; and
    using the conductive layer as a mask, removing a portion of the high k dielectric layer and the collar dielectric layer on the sidewall of the trench,
    wherein the collar dielectric layer is formed using self-starved atomic layer chemical vapor deposition (self-starved ALCVD).

11. The method of claim 10, wherein the collar dielectric layer is a silicon oxide ($SiO_2$) layer.

12. The method of claim 10, further comprising, before forming the collar dielectric layer using self-starved ALCVD, performing a surface treatment.

13. The method of claim 12, wherein the surface treatment is a standard RCA cleaning process.

14. The method of claim 10, wherein the depth of the collar dielectric layer is 1.5~3.5 um from the top of the trench.

15. The method of claim 10, wherein the capacitor dielectric layer is a high dielectric constant dielectric layer.

16. The method of claim 15, wherein the high dielectric constant dielectric layer is formed using atomic layer chemical vapor deposition (ALCVD).

17. The method of claim 15, wherein the high dielectric constant dielectric layer is an $Al_2O_3$ layer.

18. The method of claim 15, wherein a thickness of the high dielectric constant dielectric layer is 30~70 Å.

19. The method of claim 10, wherein a portion of the dielectric layer and the collar dielectric layer on the sidewall surface of the trench are removed using wet etching process.

20. A method of forming a trench capacitor comprising the steps of:
    providing a silicon substrate having a trench;
    forming a diffusion barrier layer conformably over the silicon substrate and on a portion of the sidewall of the trench;
    forming a doped layer on the diffusion barrier layer and on an exposed portion of the bottom and the lower sidewall of the trench;
    forming a cap layer on the doped layer; and
    annealing the doped layer to diffuse doped materials therein into the lower sidewall of the trench, using the diffusion barrier layer as a mask, to form a diffusion region as a bottom electrode of the trench capacitor,
    wherein the diffusion barrier layer is formed using self-starved atomic layer chemical vapor deposition (self-starved ALCVD).

21. The method of claim 20, wherein the depth of the diffusion barrier layer is 1.5~3.5 µm from the top of the trench.

22. The method of claim 20, further comprising:
    removing the cap layer and the doped layer;
    depositing a capacitor dielectric layer on the sidewall of the trench; and
    forming a conductive layer in the trench.

23. The method of claim 22, further comprising:
    recessing the conductive layer to a predetermined depth to act as a top electrode; and
    removing a portion of the capacitor dielectric layer and the diffusion barrier layer using the conductive layer as a mask.

24. The method of claim 20, wherein the diffusion barrier layer is silicon nitride or silicon oxynitride.

25. A method of forming a trench capacitor comprising the steps of:
    providing a silicon substrate having a trench;
    forming a diffusion barrier layer conformably on a portion of the sidewall of the trench;
    forming a doped layer on the diffusion barrier layer and on an exposed portion of the trench;
    forming a cap layer on the doped layer;
    annealing the doped layer to from a diffusion region as a bottom electrode of the trench capacitor;
    removing the cap layer and the doped layer in the trench;
    depositing a high dielectric constant dielectric layer conformably covering the diffusion barrier layer and extending to the bottom and the lower sidewall of the trench to act as a dielectric material of the trench capacitor;

forming a conductive layer in the trench and recessing the conductive layer to a predetermined depth to act as a top electrode of the trench capacitor; and removing a portion of the high dielectric constant dielectric layer and a portion of the diffusion barrier layer using the conductive layer as a mask, wherein the diffusion barrier layer is formed using self-starved atomic layer chemical vapor deposition (self-starved ALCVD).

* * * * *